United States Patent [19]

Parkinson

[11] 4,221,977
[45] Sep. 9, 1980

[54] STATIC I²L RAM

[75] Inventor: Ward D. Parkinson, Dallas, Tex.

[73] Assignee: Motorola, Inc., Schaumburg, Ill.

[21] Appl. No.: 968,051

[22] Filed: Dec. 11, 1978

[51] Int. Cl.³ .................... G11C 11/40; H01L 27/04
[52] U.S. Cl. .................... 307/238; 357/92;
357/50; 365/155; 365/156; 365/179; 365/181;
365/188
[58] Field of Search .................... 357/92; 307/238;
365/154, 155, 156, 174, 179, 181, 188

[56] References Cited

U.S. PATENT DOCUMENTS

| 3,643,235 | 2/1972 | Berger et al. | 357/92 |
| 3,801,967 | 4/1974 | Berger et al. | 357/92 |
| 4,021,786 | 5/1977 | Peterson | 357/92 |
| 4,032,902 | 6/1977 | Herndon | 357/52 |
| 4,112,511 | 9/1978 | Heald | 307/238 |
| 4,158,237 | 6/1979 | Wiedmann | 307/238 |

FOREIGN PATENT DOCUMENTS 2612666  9/1977  Fed. Rep. of Germany ............ 357/92
481941  10/1975  U.S.S.R. .................... 357/92

OTHER PUBLICATIONS

Wiedmann, IBM Tech. Discl. Bulletin, vol. 21, No. 1, Jun. 1978, pp. 231–232.
Wiedmann, IBM Tech. Discl. Bulletin, vol. 14, No. 6, Nov. 1971, pp. 1721–1722.

Primary Examiner—William D. Larkins
Attorney, Agent, or Firm—Vincent B. Ingrassia

[57] ABSTRACT

A unique topography of I²L bipolar semiconductor elements provides Read-Write Random Access Memory (RAM) with very high packing density, low cost, and good power and speed characteristics and with a very simple metallization pattern.

2 Claims, 5 Drawing Figures

STATIC I²L RAM

FIELD OF THE INVENTION

The instant invention relates to an I²L bipolar semiconductor configuration providing a RAM circuit with very high packing density and low power consumption and cost.

BACKGROUND OF THE INVENTION

It has been a consistent goal of the semiconductor industry to provide smaller high speed Random Access Memory (RAM) chips. Much work has been done in MOS technology, but the goal has always been to reduce costs along with size commensurate with adequate operating speed. Another goal of the industry which has been met with MOS techniques is the reduction of power, both in terms of standby and operating consumption. But the present state of the art does not provide a low power, relatively high speed, low cost circuit which has a very high packing density.

SUMMARY OF THE INVENTION

The instant invention utilizes an I²L semiconductor pattern to provide very closely spaced Random Access Memory Cells. Isolation depositions are used to isolate the cells, both each from the other and within each cell. A buried layer running under every cell in a given row provides an "$X_n$" axis select line. "$Y_n$" axis select lines are provided in the metallization pattern as complimentary inputs or outputs from each cell in a given column. The result is an extremely dense cell layout with no need for metallization crossovers.

It is, therefore, an object of the invention to provide a plurality of very high density I²L bipolar RAM cells on a small semiconductor chip.

It is another object of the invention to provide RAM cells at relatively low cost and high speed.

It is still another object of the invention to provide I²L bipolar RAM cells which require very little operating energy with high use efficiency.

These and other objects of the invention will become apparent upon study of the Detailed Description of the Invention and the Drawings in which.

DETAILED DESCRIPTION OF THE INVENTION

Figure 1:
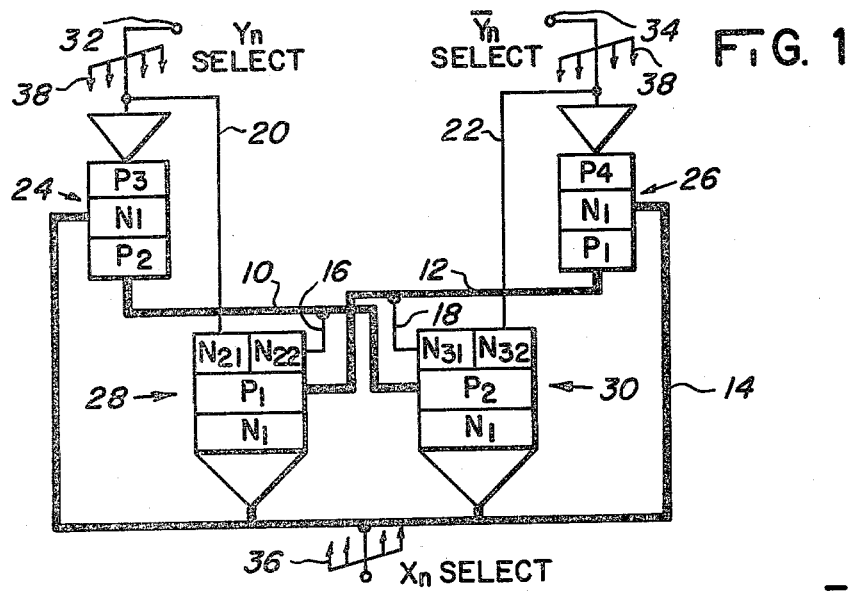
FIG. 1 is a schematic illustration of one cell of the RAM of the invention.

The preferred embodiment of the invention is disclosed in FIGS. 1-4. FIG. 1 is of pictorial schematic form for clarity of understanding of the interconnections of the invention.

Bold connection lines 10, 12, 14 of FIG. 1 represent monolithic connections or common zones within the semiconductor chip structure. Light connection lines 16, 18, 20, 22 of FIG. 1 represent a metallization pattern on the upper surface of the semiconductor chip. Like notations, such as "$N_1$" (which appears in four places) in FIG. 1, indicate identical depositions or zones of semiconductor material which is serving multiple usages in the circuit of FIG. 1 thereby providing the monolithic interconnects previously referenced, supra. It will be understood, therefore, that bold connection lines 10, 12, 14 of FIG. 1 merely indicate that identical semiconductor zones, such as the four $N_1$ zones are, in fact, one zone serving four transistor functions. This concept will become more clear to the reader upon study of the succeeding Figures. Referring again to FIG. 1, it is noted that there are four transistors 24, 26, 28, 30 represented therein. PNP transistor 24 comprises emitter $P_3$, base $N_1$ and collector $P_2$. Similar PNP transistor 26 comprises emitter $P_4$, base $N_1$ and collector $P_1$. NPN transistor 28 comprises emitter $N_1$, base $P_1$ and dual collectors $N_{21}$ and $N_{22}$. Similar NPN transistor 30 comprises emitter $N_1$, base $P_2$ and dual collectors $N_{31}$ and $N_{32}$. Transistor 28 base $P_1$ is shared with transistor 26 collector $P_1$; that is, they are located in a common semiconductor zone $P_1$. This fact is indicated by bold connecting line 12 and the common use of designation $P_1$. Similarly, base $P_2$ of transistor 30 and collector $P_2$ of transistor 24 share zone $P_2$ as indicated by bold line 10. Bases $N_1$ of transistors 24, 26 and emitters $N_1$ of transistors 28 and 30 share the common semiconductor zone $N_1$ as indicated by bold line 14 and the common designations $N_1$. Bold line 14 also serves to connect $X_n$ select to the cell, as will be further discussed below. It should be understood that subscript "n" may be used to reference any given select line in the array and that like select lines in adjacent cells (by row or column) will carry "n+1" or "n−1" subscript references.

Surface metallic connection (light line) 20 connects emitter $P_3$ of transistor 24 with collector $N_{21}$ of transistor 28. Light line connector 20 also serves as a connection to $Y_n$ Select bus 32. Surface metallic connection (light line) 22 connects emitter $P_4$ of transistor 26 to collector $N_{32}$ of transistor 30 and $\overline{Y}_n$ Select bus 34 in a similar fashion.

Surface metallic connection 16 connects collector $N_{22}$ of transistor 28 to base $P_2$ of transistor 30 and collector $P_2$ of transistor 24, the $P_2$ region being common to both elements as before stated. Surface metallic connection 18 connects collector $N_{31}$ of transistor 30 to base $P_1$ of transistor 28 and collector $P_1$ of transistor 26, the $P_1$ region being common to both elements as before stated. The operation of this circuit, as described above, will be further explained, presently.

Figure 2:
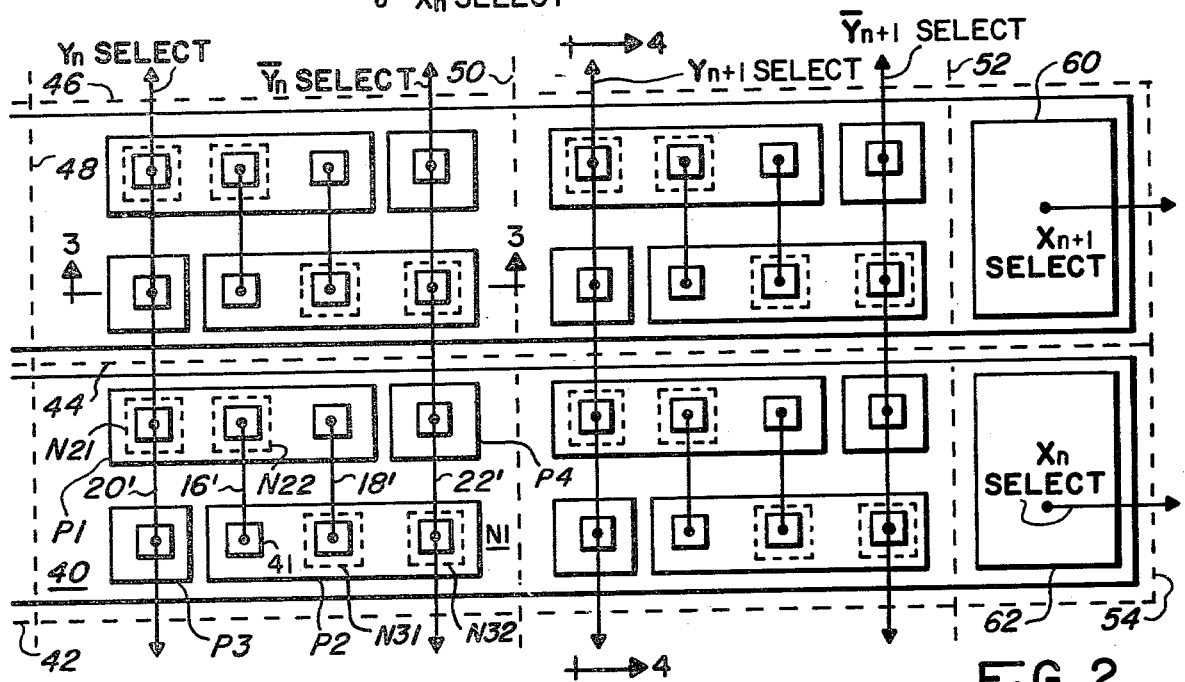
FIG. 2 is a plan view of four cells of the RAM circuit of the invention.
Figure 3:
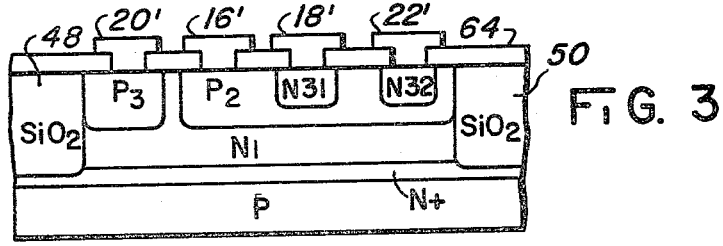
FIG. 3 is a cross-sectional view at 3—3 of FIG. 2.
Figure 4:
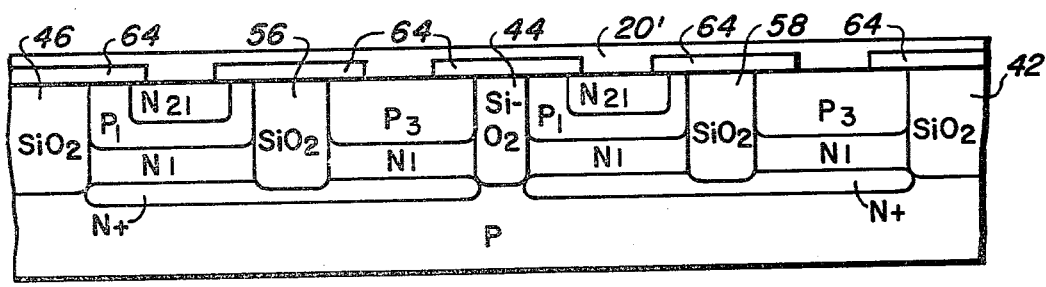
FIG. 4 is a cross-sectional view at 4—4 of FIG. 2.

FIG. 2 illustrates, in plan view, four FIG. 1 cells, a portion of a larger plurality of such cells. Cell 40 in the dashed outline in the lower left corner of FIG. 2 is typical of all such cells. Cell 40 is labeled with semiconductor zone or region designations which correspond to the zones or regions of FIG. 1. The location of each of the semiconductor regions may be more readily understood by reference to FIGS. 3 and 4, cross sectional representations of the cells of FIG. 2. It should be noted that while FIG. 3 is a cross-section in a single cell, FIG. 4 shows the cross-section of two adjacent cells. Dashed lines 42, 44, 46, 48, 50, 52, 54 of FIG. 2 represent isolation regions such as the $SiO_2$ regions shown in FIGS. 3 or 4, for example. Not all such $SiO_2$ isolation regions are so represented in FIG. 2 however; the exception being $SiO_2$ regions 56, 58 of FIG. 4. Representations of regions 56, 58 are omitted from FIG. 2 to avoid confusion in FIG. 2. As represented, the dashed lines of FIG. 2 such as 42, 48, 44 and 50, outline individual cells such as cell 40. Primed reference numerals in FIGS. 2, 3 and 4 are pictorial representations of otherwise identical but unprimed reference numerals of FIG. 1. Both the primed and identical unprimed reference numerals identify the metallic surface connectors of each of the cells.

It will be recognized that like labeled semiconductor zones of FIG. 1, such as the two $P_1$ zones for example, appear only once in each cell 40 of FIGS. 2-4. This is because there is only one of each such zone, that zone performing a multiple transistor electrode function. For example, zone $P_1$ is both the base of transistor 28 and the collector of transistor 26. Dashed line squares $N_{21}$, $N_{22}$, $N_{31}$ and $N_{32}$ in cell 40 of FIG. 2 are the multiple collectors of transistors 28 and 30 of FIG. 1. Zones $N_{31}$ and $N_{32}$ can be seen in cross-section in FIG. 3 and $N_{21}$ can be seen in two places in FIG. 4 because there are two cells represented there.

The $N_1$ layer of FIG. 2 lies under the entire cell 40 area except where it is interrupted by $SiO_2$ isolation barriers. It may be seen in the FIG. 4 cross-section that the two $N_1$ regions are both in contact with an N+ region. The N+ region is a buried layer which extends from left to right (horizontally) from cell to cell in each row, as shown in FIGS. 2 and 3 but does not extend under the $SiO_2$ isolating barriers such as 42, 44 and 46. See also these same $SiO_2$ barriers in FIG. 4. Buried layer or region N+ underlies the vertical $SiO_2$ barriers such as 48, 50 and 52 and is continuous thereunder (FIGS. 2 and 3). Near the right side of FIG. 2, $X_n$, $X_{n+1}$ Select ohmic connections 60, 62 are typical of like connections, one for each row of cells such as cell 40. Ohmic connections 60, 62 extend through an opening in $SiO_2$ surface isolation layer 64 (see FIGS. 3 and 4) to at least epitaxial layer $N_1$. There are no other P and N layers disposed in this region which is not shown in the cross-section drawings. The $X_n$ Select metallic connections are a continuation of ohmic connections such as 60, 62, as represented by solid lines $X_n$ Select in FIG. 2.

Solid line squares such as 41 of each cell such as 40, FIG. 2, represent ohmic contacts with the underlying semiconductor regions which are labeled, such as $P_1$, $P_2$, etc. These ohmic contacts provide connections from surface metallic conductors 20', 22', 16' and 18' to the underlying semiconductor regions through openings in surface protective layer 64, FIG. 2, which may be $SiO_2$.

This completes the physical description of the cell structure of the chip of the invention. The techniques for fabricating each element of the structure are well known to those of average skill in the semiconductor art and are not treated in detail here.

In operation, the $SiO_2$ isolating barriers such as 42, 44, 46 serve to isolate the plurality of cells such as 40 in the vertical direction (see FIG. 2). Isolating barriers such as 48, 50 and 52 serve a similar purpose in the horizontal direction except that buried layer N+ (FIG. 3) extends beneath isolation barriers such as 48, 50 and 52 to provide a common electrical connection to all $N_1$ layers of all cells such as 40 in a given horizontal row. This multiple connection for each $X_n$ Select bus is represented in FIG. 1 by the showing of four extra open ended connections 36 to the $X_n$ Select bus. Of course, the actual number of such connections depend on the actual number of horizontal cell rows of FIG. 2. Similarly, the multiple connections to the $Y_n$ and $\overline{Y}_n$ Select buses of FIG. 1 are each represented by four extra open ended wires or connections 38. Again, the actual number will depend on the number of cell columns in the vertical direction, FIG. 2.

Each cell 40 of the type shown in FIG. 2 and the cross-sections thereof in FIGS. 3 and 4 is a Random Access Memory (RAM) cell. The structure shown in the Figures is of the type generally known as Integrated Injection Logic ($I^2L$). The use of the epitaxial layer $N_1$ on a P substrate (see FIGS. 3, 4) allows the use of buried layer N+ to make the common $X_n$ electrical connections to all RAM cells in a given row. In addition, the use of $SiO_2$ barriers for isolation both within each cell and between cells allows operation with substantially reduced parasitic effects and also allows very high packing density of the RAM cells. It should also be noted that the combination of the particular cell circuit chosen (FIG. 1) and the structural layout (FIG. 2) allows for parallel configuration of all surface metal conductors (see FIG. 2) a particularly compact configuration without crossovers which also contributes to very high density and, consequently, very efficient use of semiconductor chip surface area.

The use of buried layers N+ to make the $X_n$ Select bus connections to all RAM cells in a given row provide a means for avoiding surface metal conductor cross-overs and thereby a single metal layer interconnect. All select connections to the chip are made at the edges of the chip, the $X_n$, $X_{n+1}$ connections at the left and right and the $Y_n$, $\overline{Y}_n$, $Y_{n+1}$, $\overline{Y}_{n+1}$ connections at the top and bottom, as shown in the preferred embodiment of FIG. 2. Of course, other variations of the configuration of the preferred embodiment may yield equally efficient results.

In order to understand the operation of a cell such as 40, it should be understood that the following is true at the outset (see FIG. 1):

$X_n = 1.0$ volt.

$Y_n = 1.7$ volts.

Transistor 24 is conducting (ON).

Transistor 30 is ON, base drive is supplied from the collector of transistor 24. That is, both collectors of transistor 30 are conducting.

Transistor 28 is cut off. Collector $N_{31}$ of transistor 30 "steals" any base drive supplied to base $P_1$ of transistor 28.

Since $Y_n = 1.7$ volts, transistor 26 is ON.

Transistor 26 sources collector current to transistor 30 but transistor 30 sinks all this current so that no current is available to turn on transistor 28.

X Selection

Note that all cells in a given column are coupled to the same $Y_n$ and $\overline{Y}_n$ lines. If the $X_n$ node for one cell is pulled 100 mV lower then the $X_n$ nodes for the other cells, than transistor 26 base-emitter junctions in that cell will be forward biased by 100 mV more than the corresponding devices in the other cells. With greater forward bias, transistor 26 devices in the selected cell are each able to conduct about 50 times as much current as the other cells at normal ambient temperature.

Read Operation

The state stored by the selected cell in any column can be sensed by differentially comparing the current conducted by conductor $Y_n$ versus conductor $\overline{Y}_n$.

Remembering that transistor 30 is ON while transistor 28 is OFF, transistor 24 need only supply base current to transistor 30 so the emitter current of transistor 24 is relatively small. Thus, node $Y_n$ draws a small current from the $Y_n$ conductor.

On the other hand, transistor 26 sources collector current to transistor 30 so the emitter current of transistor 26 is relatively large. Thus a relatively large current is drawn from the $\overline{Y}_n$ conductor.

The $Y_n$ and $\overline{Y}_n$ nodes in the other unselected cells draw smaller currents; if the other cells are of the opposite state from the selected cell, then the amount of current differential in the $Y_n$ and $\overline{Y}_n$ conductors will be less.

Another factor which decreases the difference in the currents conducted by node $Y_n$ and node $\overline{Y}_n$ is that both transistors 24 and 26 are ON, and therefore they both draw a base current component. The higher the gain (B pnp lateral) of the lateral PNP, the larger will be the differential through $Y_n$ and $\overline{Y}_n$.

Write Operation

One of row select $X_n$ conductors is pulled lower than the others such that devices 24, 26 for each cell 40 in the selected row are forward biased more heavily than devices 24, 26 in the cells in all other rows. The voltage on the $Y_n$ and $\overline{Y}_n$ conductors for a particular column is forced to be higher than the voltage on the $Y_n$ and $\overline{Y}_n$ conductors for all other columns. This causes devices 24, 26 of all cells in the particular column to be more forward biased than devices 24, 26 in cells in other columns.

Where the selected row and selected column intersect, devices 24, 26 will be more heavily forward biased than like devices in any other cell in the selected row or selected column, and devices 24, 26 at the intersection will be much more heavily forward biased than in a cell which neither falls within the selected row nor the selected column.

Therefore, only the cell at the intersection of the selected row and column will conduct currents corresponding to 0.8 volt forward bias of transistors 24, 26.

To write, either the $Y_n$ or $\overline{Y}_n$ conductor in the selected column is temporarily pulled to a lower voltage. If $Y_n$ is pulled low, then transistor 24 in the selected cell is cutoff, and transistor 30 will no longer be supplied with base drive, so it will turn OFF. This allows the collector current of transistor 26 to flow into the base terminals of transistor 28, thereby turning it ON. When conductor $Y_n$ is taken back to the higher voltage on conductor $\overline{Y}_n$, transistor 24 once again turns ON, but now one collector of transistor 28 steals away any base drive that previously kept transistor 30 turned ON.

Figure 5:
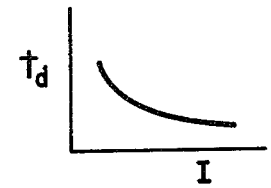
FIG. 5 is a graphic representation of I²L delay as a function of drive current in the RAM cell of the invention.

This same effect will take place in all of the other cells in the selected column if conductor Y were left at a low level for a long time. Since the other cells in the selected column have 1/50 to 1/100 of the current in the selected cell, these cells take more time to switch. See FIG. 5 for the delay $T_d$ vs. I characteristics.

The duration of the low level on the $Y_n$ (or $\overline{Y}_n$) conductor during a WRITE operation is timed so that only the selected cell can respond in the given time. The duration of the internal WRITE pulse may be timed by a dummy cell (not shown) that has a cell current comparable to that of the selected cell. When the dummy cell has switched, then the write pulse is ended since the selected cell should be the same speed as the dummy cell. This completes the operational description of the invention.

While the invention has been particularly shown and described with reference to a preferred embodiment thereof, it will be understood by those skilled in the art that various other modifications and changes may be made to the present invention from the principles of the invention described above without departing from the spirit and scope thereof, as encompased in the accompanying claims. Therefore, it is intended in the appended claims to cover all such equivalent variations as come within the scope of the invention as described.

What is claimed is:

1. A plurality of I²L semiconductor memory cell circuits on a chip for selection by a plurality of select lines, each of said plurality of memory cells comprising in combination;

a first transistor of a first semiconductor type said first transistor having an emitter, a base and a collector;

a second transistor of said first semiconductor type said second transistor having an emitter, a base and a collector;

a third transistor of a second semiconductor type, said third transistor having a first and a second collector, a base and an emitter;

a fourth transistor of said second semiconductor type; said fourth transistor having a first and a second collector, a base and an emitter, said emitter of said first transistor being connected to said first collector of said third transistor and to a first of the plualitly of select lines, said collector of said first transistor being connected to said second collector of said third transistor and to said base of said fourth transistor, said base of said first transistor being connected to said base of said second transistor, to said emitter of said third transistor, to said emitter of said fourth transistor and to a third of the plurality of select lines, said emitter of said second transistor being connected to said first collector of said fourth transistor and to a second of the plurality of select lines and said collector of said second transistor being connected to said second collector of said fourth transistor and to said base of said third transistor.

2. The memory cell circuit according to claim 1 wherein said base of said third transistor and said collector of said second transistor are formed in a first isolated layer of a semiconductor chip, said base of said fourth transistor and said collector of said first transistor are formed in a second isolated layer of said semiconductor chip and said base of said first and second transistors and said emitters of said third and fourth transistors are formed in an isolated epitaxial layer of said semiconductor chip.

* * * * *